US009537065B2

(12) United States Patent
Sota et al.

(10) Patent No.: US 9,537,065 B2
(45) Date of Patent: Jan. 3, 2017

(54) LIGHT-EMITTING DEVICE WITH REFLECTIVE RESIN

(75) Inventors: Yoshiki Sota, Osaka (JP); Masayuki Ohta, Osaka (JP); Kazuo Tamaki, Osaka (JP); Shinji Yamaguchi, Osaka (JP); Shin Itoh, Osaka (JP); Tomoshi Kimura, Osaka (JP); Masaki Tatsumi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/236,930

(22) PCT Filed: May 31, 2012

(86) PCT No.: PCT/JP2012/003593
§ 371 (c)(1),
(2), (4) Date: Feb. 4, 2014

(87) PCT Pub. No.: WO2013/024560
PCT Pub. Date: Feb. 21, 2013

(65) Prior Publication Data
US 2014/0159076 A1   Jun. 12, 2014

(30) Foreign Application Priority Data
Aug. 12, 2011   (JP) .................... 2011-177323

(51) Int. Cl.
*H01L 33/54* (2010.01)
*H01L 33/60* (2010.01)
(Continued)

(52) U.S. Cl.
CPC ............. *H01L 33/507* (2013.01); *H01L 24/83* (2013.01); *H01L 24/85* (2013.01); *H01L 27/156* (2013.01);
(Continued)

(58) Field of Classification Search
CPC .................... H01L 33/00–33/648; H01L 33/60; H01L 33/62
(Continued)

(56) References Cited

U.S. PATENT DOCUMENTS 5,221,428 A  *  6/1993  Ohsawa et al. ................. 216/14
6,140,153 A     10/2000  Ohsawa et al.
(Continued)

FOREIGN PATENT DOCUMENTS

EP   1 408 559 A2   4/2004
EP   2 325 901 A1   5/2011
(Continued)

OTHER PUBLICATIONS

TW Office Action and partial English translation thereof mailed Jun. 11, 2014 in Taiwanese Application 101128500.
(Continued)

*Primary Examiner* — Eric Ward
(74) *Attorney, Agent, or Firm* — Nixon & Vanderhye P.C.

(57) ABSTRACT

Improves light extraction efficiency. A light emitting device 1 using a white resin molding package 5 integrally molded with lead frames 3, 4 constituting an electrode corresponding to one or a plurality of light emitting element 2 and white resin, wherein an area in a plane view of a white resin surface on a reflective surface that is level with amounting surface of the light emitting element 2 is configured to be larger than total area in a plane view occupied by surfaces of the lead frames 3, 4 and the light emitting element. Further, a step section is formed on the surfaces of lead frames 3, 4, white resin is filled in the step section, and the area of white resin surface on a reflective surface where the light emitting element 2 is mounted is increased.

20 Claims, 7 Drawing Sheets

(51) Int. Cl.
*H01L 33/62* (2010.01)
*H01L 33/50* (2010.01)
*H01L 27/15* (2006.01)
*H01L 23/498* (2006.01)
*H01L 23/00* (2006.01)

(52) U.S. Cl.
CPC ............... *H01L 33/60* (2013.01); *H01L 33/62* (2013.01); *H01L 23/49861* (2013.01); *H01L 24/32* (2013.01); *H01L 24/48* (2013.01); *H01L 24/73* (2013.01); *H01L 2224/32245* (2013.01); *H01L 2224/48091* (2013.01); *H01L 2224/48247* (2013.01); *H01L 2224/48257* (2013.01); *H01L 2224/48465* (2013.01); *H01L 2224/73265* (2013.01); *H01L 2224/83012* (2013.01); *H01L 2224/83439* (2013.01); *H01L 2224/85012* (2013.01); *H01L 2224/85439* (2013.01); *H01L 2224/92247* (2013.01); *H01L 2924/00014* (2013.01); *H01L 2924/12041* (2013.01); *H01L 2924/181* (2013.01)

(58) Field of Classification Search
USPC ..................................................... 257/79, 88
See application file for complete search history.

(56) References Cited

U.S. PATENT DOCUMENTS

| 2007/0262339 | A1 | 11/2007 | Hussell et al. | |
|---|---|---|---|---|
| 2009/0197360 | A1* | 8/2009 | Han et al. | 438/26 |
| 2010/0102347 | A1* | 4/2010 | Oyamada | 257/98 |
| 2011/0133232 | A1* | 6/2011 | Yoshioka et al. | 257/98 |
| 2011/0227105 | A1* | 9/2011 | Hwu et al. | 257/91 |
| 2012/0074451 | A1* | 3/2012 | Lin | H01L 33/62 257/99 |
| 2012/0300491 | A1* | 11/2012 | Hussell | H01L 33/486 362/602 |

FOREIGN PATENT DOCUMENTS

| JP | 10-335569 | | 12/1998 |
|---|---|---|---|
| JP | 2000-232196 | | 8/2000 |
| JP | 2007-042668 | | 2/2007 |
| JP | 2007-201230 | A | 8/2007 |
| JP | 2009-534866 | | 9/2009 |
| JP | 2010-153666 | | 7/2010 |
| JP | 2010-182880 | A | 8/2010 |
| JP | 2011-9143 | A | 1/2011 |
| JP | 2011-77090 | | 4/2011 |
| TW | 1236159 | B | 8/2004 |
| TW | 201021252 | A1 | 6/2010 |

OTHER PUBLICATIONS

International Search Report for PCT/JP2012/003593, dated Jul. 24, 2012.
Written Opinion of the ISA for PCT/JP2012/003593, dated Jul. 24, 2012.
JP Final Office Action and partial English translation thereof mailed Jul. 2, 2015 in Japanese Application 2011-1777323.
JP Office Action and partial English translation thereof mailed Mar. 19, 2015 in Japanese Application 2011-1777323.

* cited by examiner

ES layer becomes an anchor for insert molding resin

LIGHT-EMITTING DEVICE WITH REFLECTIVE RESIN

This application is the U.S. national phase of International Application No. PCT/JP2012/003593 filed 31 May 2012 which designated the U.S. and claims priority to JP Patent Application No. 2011-177323 filed 12 Aug. 2011, the entire contents of each of which are hereby incorporated by reference.

TECHNICAL FIELD

The present invention relates to a light emitting device such as an LED device that is integrally molded with lead frames corresponding to each electrode and resin.

BACKGROUND ART

This type of conventional light emitting device is integrally molded with lead frames corresponding to each electrode and resin. This is proposed in Patent Literatures 1 and 2.

FIG. 6 is a cross-sectional view of an essential part for explaining a light emitting device that is an example of a conventional light emitting device disclosed in Patent Literature 1.

In FIG. 6, a conventional light emitting device 100 comprises a metallic lead frame 101, a light emitting element 102, reflective resin material 103, and lens resin material 104. The metallic lead frame 101 is divided into a semiconductor light emitting element mounting section 106 and a metal wire connection section 107 by a slit 105. The metallic lead frame 101 is provided with a semiconductor light emitting element mounting region 108 for mounting the light emitting element 102, and a recess section 109 is provided around the semiconductor light emitting element mounting region 108 so as to surround the semiconductor light emitting element mounting region 108. A silver plating 111 is formed, among the entire mounting surface of the light emitting element 102 on the metallic lead frame 101, on a bonding region where the light emitting element 102 and a metal wire 110 are electrically connected.

The recess section 109 is formed on the side of a surface for mounting the light emitting element 102 of the metallic lead frame 101, and a reflective body 112 is formed such that the edge section thereof is positioned by a formation region of the recess section 109. Next, the light emitting element 102 is mounted and the light emitting element 102 is covered by using a transfer molding technique to fill a region surrounded by the reflective body 112 with lens resin material 104.

The light emitting element 102 is, for example, an LED chip, and is mounted on the semiconductor light emitting element mounting region 108 with electrically conductive adhesive material 113 interposed therebetween.

FIG. 7 is a plane view of a side-view type surface-mount light emitting diode as a conventional light emitting device disclosed in Patent Literature 2.

In FIG. 7, in a conventional light emitting device 200, a recess section 203 that constitutes an opening section where light emitting elements 202 (202R, 202G, 202B) are arranged is formed on a light emitting surface, which is a side surface of a package 201. In the recess section 203, the light emitting elements 202 are arranged. The light emitting elements 202 are comprised of a red light emitting element 202R, a blue light emitting element 202B, and a green light emitting element 202G. Each light emitting element 202 (202R, 202G, 202B) is arranged in a line in the longitudinal direction of the bottom surface of the recess section 203 of the package 201.

Furthermore, silver-plated metallic member region 204 where the light emitting elements 202 (202R, 202G, 202B) are mounted is arranged on the bottom surface of the recess section 203 of the package 201. Further, on one side of the package 201 in the longitudinal direction, a plurality of extraction electrodes 206 made of silver-plated copper plate patterns, which connects an electrode (not shown) of the light emitting element 202 by an electrically conductive wire 205, are arranged while being spaced apart by a resin section 207 with a convex shape with, for example, a height of about 10 micrometers and a width of about 90 micrometers. Further, in the recess section 203, the resin section 207 with a convex shape for spacing apart the metallic member region 204 into multiple regions, covering resin 208 formed on the metallic member region 204, and sealing resin (not shown due to being a transparent resin) covering the metallic member region 204 are arranged additionally. The resin section 207 with a convex shape and the covering resin 208 are in contact with the sealing resin. Further, the resin with a convex shape is not formed below the wire 205 that electrically connects the light emitting element 202 and the extraction electrode 206 (section indicated by an arrow 209). Furthermore, resin 210 of the package 201 is exposed at the bottom surface of the recess section 203 of the package 201.

The resin constituting the package 201 and the covering resin 208 are the same material, and the covering resin 208 and the sealing resin are the same resin material. Further, on the inside of sloping surfaces of the recess section 203 of the package 201, mirror plane processing is applied by mirror plane plating with aluminum or silver.

The covering resin 208 is formed to the vicinity of the light emitting element 202 to cover the extraction electrodes 204 and 206 from the bottom section of the sloping surface in the longitudinal direction, and is extended to be formed as a single entity to cover metallic sections (such as the electrodes section) from the bottom surface of the recess section 203 of the package 201.

The surface mount type package 201 is formed by the following: after punching out a silver-plated copper plate containing steel with a die to pattern a metal section having a desired shape, the top and bottom of the metal plate is sandwiched by a metal mold that is then infused with polyphthalamide (PPA) and hardened to integrally mold the extraction electrodes 204 and 206 and the hardened resin.

CITATION LIST

Patent Literature

Patent Literature 1: Japanese Laid-Open Publication No. 2011-119557
Patent Literature 2: Japanese Laid-Open Publication No. 2009-188201

SUMMARY OF INVENTION

Technical Problem

The light emitting devices of Patent Literatures 1 and 2 are light emitting devices that can be formed at low cost, and are employed in various usages. However, when considered for use as an LED-BL for a liquid crystal television or an LED light source for general lighting, it cannot be said that the light emitting devices of Patent Literatures 1 and 2 are sufficient on the point of reliability in terms of high temperature environment operation or longevity. For this reason, in recent times, the use of thermosetting resin (such as silicone resin), which has excellent light-resistance and weather-resistance, but has issues in terms of strength after molding and moldability, is considered, and improvements in moldability and strength after molding has been made. Further, higher burr generation is seen at the time of molding for thermosetting resin in comparison to thermoplastic resin that is conventionally used, and blasting process (shower including particles) is thus needed. In the light emitting device of Patent Literature 1, when thermosetting resin (such as silicone resin) is applied as a reflective resin material (base material of a package), since most of the semiconductor light emitting element mounting region 108 is the surface of the metallic lead frame 101, the high reflective film such as Ag mirror surface plating formed on the lead frame surface is degraded upon the above mentioned blasting process, and reflectivity at the semiconductor light emitting element mounting region decreases. Further, in Patent Literature 2, the covering resin 208 covering a part of the metallic member region 204 (integrated with the resin constituting the package 201) is formed to occupy a large area of the bottom surface of the recess section 203 (mounting surface where each light emitting element 202 is arranged), but is formed in a convex shape that is not level with the metallic member region 204. Thus, unnecessary reflection/scattering of light occurs, which is not desirable as a light emitting device in terms of optical design.

Further, as in Patent Literature 1, in case of a configuration where there is no reflective resin material 103 on the bottom surface of the recess section 109 (mounting surface of the light emitting element) and this surface is occupied by the metallic lead frame 101, it cannot be said that the adhesive strength between the lens resin material 104 and the metallic lead frame 101 is sufficient when considering a use in a high temperature environment or use over a long period of time as a light emitting device. Thus, degradation such as peeling occurs, which makes it insufficient in the aspect of reliability.

The present invention is intended to solve the conventional problems described above. It is an objective of the present invention to provide a light emitting device capable of improving reliability and light extraction efficiency at low cost.

Solution to Problem

A light emitting device according to the present invention using a white resin molding package integrally molded with lead frames constituting electrodes corresponding to one or a plurality of light emitting element and white resin is provided, where an area in a plane view of a white resin surface on a reflective surface that is level with amounting surface of the light emitting element is configured to be larger than an area in a plane view occupied by the lead frame surfaces and the light emitting element, thereby achieving the objective described above.

Preferably, in a light emitting device according to the present invention, a step section is formed on a part of the surfaces of the lead frames, white resin is filled in the step section, a surface of the filled white resin and the surfaces of the lead frames except the step section are formed to be level with the mounting surface of the light emitting element; and the one or plurality of light emitting element is mounted on the surface of the lead frame except the step section.

Still preferably, in a light emitting device according to the present invention, the lead frames have a light emitting element arrangement region and a terminal connection region where the one or plurality of light emitting element is mounted and a terminal of the one or plurality of light emitting element is connected; the step section is provided around the light emitting element arrangement region and the terminal connection region as a region that is lowered from the mounting surface of the one or plurality of light emitting element; and the white resin is provided in the lowered region.

Still preferably, in a light emitting device according to the present invention, a ratio of an area in a plane view of a white resin surface on a reflective surface that is level with the mounting surface of the light emitting element to an area in a plane view of the mounting surface of the light emitting element is greater than or equal to two thirds, three fourths, or four fifths.

Still preferably, in a light emitting device according to the present invention, a ratio of an area in a plane view of a white resin surface on a reflective surface that is level with the mounting surface of the light emitting element to an area in a plane view of the mounting surface of the light emitting element exceeds one half and is less than or equal to five sixths.

Still preferably, in a light emitting device according to the present invention, on the light emitting element arrangement region, a metallic surface of the lead frame is exposed, or a metallic layer formed on the lead frame is exposed.

Still preferably, in a light emitting device according to the present invention, the light emitting element arrangement region of the lead frame is smaller than an installation surface of the light emitting element.

Still preferably, in a light emitting device according to the present invention, a part of the lead frames that is in contact with a cavity wall surface of the white resin molding package directly underneath the cavity wall surface is half-etched, and white resin is filled in the half-etched region.

Still preferably, in a light emitting device according to the present invention, silicone resin is used for the white resin.

Still preferably, in a light emitting device according to the present invention, a recess section is formed to open upwards on the white resin molding package, and the one or plurality of light emitting elements is mounted on the lead frame in the recess section, while side surfaces in the recess section is formed to taper open towards the outside as a reflective wall.

Still preferably, in a light emitting device according to the present invention, reflective walls having a uniform taper of the white resin are formed on four sides, on a bottom section surrounded by the reflective walls, a metallic section is exposed on a region securing electrical connection between the light emitting element and the lead frames and regions other than said region are covered with the white resin.

Still preferably, in a light emitting device according to the present invention, the lead frames are metallic material having a laminated configuration with an ES (etching stop) metallic layer and a base metallic layer laminated on top and bottom.

The functions of the present invention having the structures described above will be described hereinafter.

In the present invention, the area in a plane view of a white resin surface on a reflective surface that is level with a mounting surface of a light emitting element is configured to be larger than the area in a plane view occupied by a lead frame surface and a light emitting element.

Further, a step section is formed on a part of the surface of the lead frame, white resin is filled in the step section, and the surface of the white resin that is filled with high reflectivity and the surface of the lead frame are formed to be level.

Thereby, the area in a plane view of the white resin surface on the reflective surface that is level with the mounting surface of the light emitting element is configured to be larger than the area in a plane view occupied by the lead frame surface and the light emitting element. Thus, the light extraction efficiency can be improved due to the high reflectivity of the white resin.

Further, since the step section is formed on the lead frame surface, white resin contributing to reflection is filled in the step section, and the area of the white resin surface on the reflective surface where the light emitting element is mounted is increased, light extraction efficiency can be improved.

Advantageous Effects of Invention

According to the present invention described above, the area in a plane view of a white resin surface on a reflective surface that is level with a mounting surface of a light emitting element is configured to be larger than the area in a plane view occupied by a lead frame surface and a light emitting element. Thus, light extraction efficiency can be improved due to high reflectivity of the white resin.

Since a step section is formed on the lead frame surface, white resin is filled in the step section, and the area of the white resin surface on the reflective surface where the light emitting element is mounted is increased, the light extraction efficiency can be improved.

Further, since the step section is formed on the lead frame surface, white resin is filled in the step section, and the lead frame surface is formed to be level with the white resin surface, light extraction efficiency can be improved without the reflective surface where the light emitting element is mounted becoming uneven.

Furthermore, since the area of the white resin surface on the reflective surface where the light emitting element is mounted is larger than the area occupied by the lead frame surface and the light emitting element chip, light extraction efficiency can be improved.

Furthermore, since the step section is formed on the lead frame surface, white resin is filled into the step section, and the adhesion area between a reflector of a cavity and the lead frame increases, strength against lateral pressure of a cavity wall surface can be greatly improved.

Figure 1:
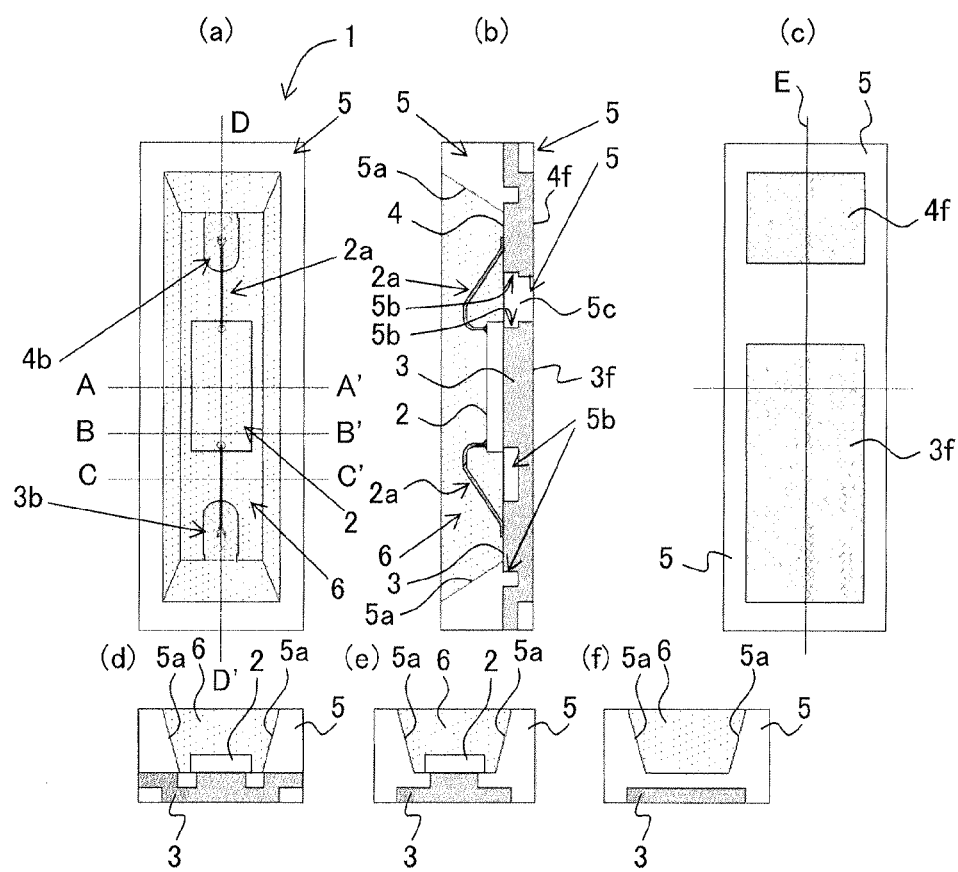
FIG. 1(a) is a plane view illustrating an example of a configuration of an essential part of a light emitting device such as an LED device in Embodiment 1 of the present application.
FIG. 1(b) is a DD' line cross-sectional view illustrating a cross-sectional configuration in the longitudinal direction of the light emitting device of FIG. 1(a).
FIG. 1(c) is a back view of the light emitting device of FIG. 1(a).
FIG. 1(d) is an AA' line cross-sectional view of the light emitting device of FIG. 1(a).
FIG. 1(e) is a BB' line cross-sectional view of the light emitting device of FIG. 1(a)
FIG. 1(f) is a CC' line cross-sectional view of the light emitting device of FIG. 1(a).

REFERENCE SIGNS LIST 1 light emitting device
2 light emitting element
2a wire
3, 4 lead frame
3a light emitting element arrangement region
3b, 4b wire-bonding region (terminal connection region)
3c, 4c half-etched region
3d, 4d hanger lead
3e, 4e base section of a hanger lead
3f, 4f installation surface of a lead frame
5 package
5a side surface of a reflective wall in a recession section
5b white resin on a half-etched region
6 inner resin
8 anode/cathode separation region
E center line

DESCRIPTION OF EMBODIMENTS

Hereinafter, Embodiment 1 of a light emitting device and the production method thereof of the present invention will be described with reference to the accompanying figures. With respect to the prepared figures, thicknesses, lengths or the like of each element in each figure are not limited to the configuration shown in the figure.

Embodiment 1

FIG. 1(a) is a plane view illustrating an example of a configuration of an essential part of a light emitting device such as an LED device in Embodiment 1 of the present application. FIG. 1(b) is a DD line cross-sectional view illustrating a cross-sectional configuration in the longitudinal direction of the light emitting device of FIG. 1(a). FIG. 1(c) is a back view of the light emitting device of FIG. 1(a). FIG. 1(d) is an AA' line cross-sectional view of the light emitting device of FIG. 1(a). FIG. 1(e) is a BB line cross-sectional view of the light emitting device of FIG. 1(a), and FIG. 1(f) is a CC' line cross-sectional view of the light emitting device of FIG. 1(a). FIG. 2 is a plane view illustrating an example of a configuration of an essential part of a lead frame used in the light emitting device of FIG. 1(a). The dashed line of FIG. 2 illustrates the position of the outer shape of package 5.

In FIGS. 1(a) to 1(f) and FIG. 2, a light emitting device 1 such as an LED device of Embodiment 1 has a light emitting element 2 such as an LED element that emits light, a metallic lead frame 3 which constitutes one of the electrodes and where the light emitting element 2 is arranged, a lead frame 4 which constitutes the other electrode, a white resin cavity molded package 5 using white resin that is integrally resin molded with the pair of lead frames 3 and 4, and a sealing inner resin 6 for filling the inside of a recess section of the package 5 constituted of white resin with the optical element 2. In other words, the light emitting device 1 is mounted with the light emitting element 2 that emits light, and uses the white resin cavity molded package 5 which is integrally molded with the pair of lead frames 3, 4 constituting the electrodes that correspond to the light emitting element 2 and white resin.

The light emitting element 2 such as an LED element is fixed on a light emitting element arrangement region 3*a* on the lead frame 3 with an adhesive or the like. On a region directly under a mounting surface of the light, emitting element 2 (light emitting element arrangement region 3*a*), a metallic surface of the lead frame 3 or a metallic layer (for example, silver plating) formed on the lead frame 3 is exposed. For wire-bonding regions 3*b*, 4*b* as terminal connection regions, it is desirable that the metallic surfaces of the lead frames 3, 4 or the metallic layers (for example, silver plating) formed on the lead frames 3, 4 are exposed. A wire 2*a* from one of terminals of the light emitting element 2 is wire-bonded and electrically connected to the wire-bonding region 3*b* as the terminal connection region of the lead frame 3. A wire 2*a* from the other terminal of the light emitting element 2 is wire-bonded and electrically connected to the wire-bonding region 4*b* as the terminal connection region of the lead frame 4. In this case, the light emitting element arrangement region 3*a* of the lead frame 3 is smaller than the installation surface of the light emitting element 2, and the light emitting element arrangement region 3*a* cannot be seen due to the light emitting element 2 when the light emitting device is viewed in a plane view. However, if the ratio of the bottom surface in the recess section of the package 5 occupied by white resin can be made to be greater than or equal to half as described below, the light emitting element arrangement region 3*a* of the lead frame 3 is smaller than the installation surface of the light emitting element 2, but does not necessarily have to be smaller. The light emitting element arrangement region 3*a* of the lead frame 3 can be of equal or larger size, and can be formed offset from the actual installation surface of the light emitting element 2.

In the lead frame 3, as illustrated in FIG. 2, a region surrounding the light emitting element arrangement region 3*a* and the wire-bonding region 3*b* is a half-etched region 3*c* that is half-etched to be lowered to about half a thickness. Here, half-etching refers to etching to a predetermined part of base material of the lead frame 3 that thins the original thickness of the base material to about half the thickness (precisely half the thickness in the present Embodiment, but includes not only half the thickness, but cases with large thickness to a certain degree). Etching is a method using an acidic or alkaline solution, but may use other methods such as press work in combination therewith. Similarly, in the lead frame 4, a region surrounding the wire-bonding region 4*b* is a half-etched region 4*c* that is half-etched to be lowered to about half a thickness. These half-etched regions 3*c*, 4*c* are lowered to half the thickness of the lead frames 3, 4. On the lowered part, white resin constituting the package 5 is positioned by flowing around. Thereby, ratio of the area occupied by white resin on the bottom surface of the recess section of the package 5 is increased to greater than or equal to half. This acts to better reflect a light from the light emitting element 2.

The lead frames 3, 4 are provided with: the light emitting element arrangement region 3*a* and the wire-bonding region 3*b*, 4*b* as a terminal connection region where the light emitting element 2 is mounted and a terminal of the light emitting element 2 is connected (herein, wire-bonded); and half-etched regions 3*c*, 4*c* that are lowered from the mounting surface of the light emitting element 2 around the light emitting element arrangement region 3*a* and the wire-bonding region 3*b*, 4*b*. On these half-etched regions 3*c*, 4*c*, white resin is provided. The surface of the provided white resin and the mounting surface of the light emitting element 2 are configured to be level.

The light emitting device 1 is mounted with the light emitting element 2 and has a pair of lead frames 3, 4 constituting each electrode that is wire-bonded with the light emitting element 2. Prior to being singulated into each light emitting device 1, a plurality of pairs having a pair of lead frames 3, 4 are arranged in a matrix pattern. A retention section is provided for linking between each of adjacent lead frames 3, 3 and adjacent lead frames 4, 4. The retention section is generally called "suspension". The retention section between adjacent lead frames will be called hanger leads 3*d*, 4*d* (also referred to as suspension lead). Base sections 3*e*, 4*e* of hanger leads 3*d*, 4*d* are not half-etched in order to secure strength, thus the thicknesses of lead frames 3, 4 are maintained. The lead frames 3, 4 act as each electrode of the light emitting element 2. The lead frame 3 also has heat radiation function.

Figure 2:
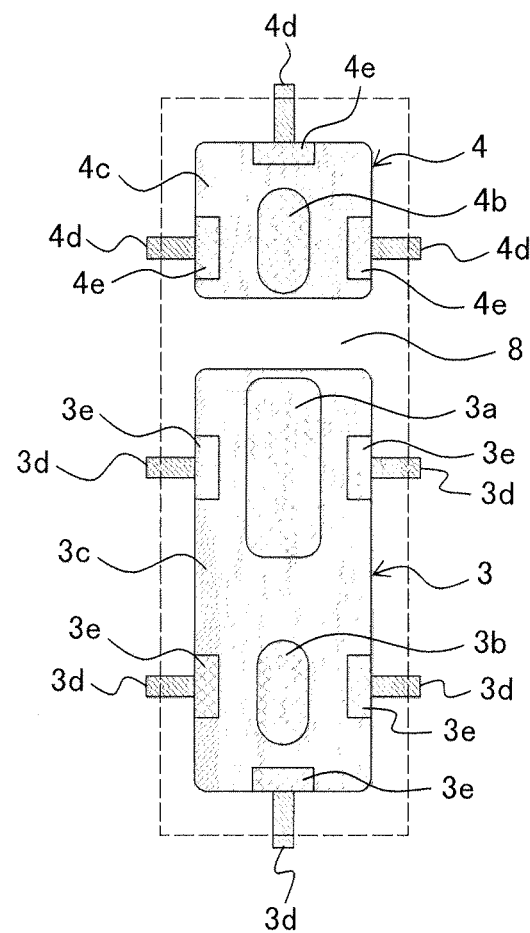
FIG. 2 is a plane view illustrating an example of a configuration of an essential part of a lead frame used in the light emitting device of FIG. 1(a).

On the lead frames 3, 4, the hanger leads 3*d*, 4*d* and the base sections 3*e*, 4*e* thereof, light emitting element arrangement region 3*a*, wire-bonding regions 3*b*, 4*b*, and half etched regions 3*c*, 4*c* may be arranged symmetrically or asymmetrically to left and right with respect to the center line E in the longitudinal direction illustrated in FIG. 1(*c*).

On the installation surface (back surface) of the light emitting device 1, as illustrated in FIG. 1(*c*), quadrangular installation surfaces 3*f*, 4*f* of the lead frames 3, 4 are each surrounded by white resin constituting the package 5 and are arranged symmetrically to left and right with respect to the center line E in the longitudinal direction illustrated in FIG. 1(*c*).

White resin is Pkg resin made by adding (to give reflective property) light diffusion material such as titanium oxide to thermosetting resin. For example, silicone resin (hard and brittle) is used as thermosetting resin. For the quality of Pkg resin that is white resin, although not specifically limiting, thermosetting resin with excellent heat resistance and light resistance is preferred, and other than silicone, there is epoxy, polyphthalamide (PPA), and organomodified resin thereof. On the package 5, a recess section with a rectangular shape in a plane view having four side walls in the perimeter is formed to open upwards. In the recess section, four side surfaces 5*a* of the reflective wall are formed to taper open towards the outside in four directions. In this manner, reflective walls of white resin having a taper are formed on four sides. The bottom section surrounded by the reflective walls exposes the metallic section or the metallic layer to the terminal connection regions (wire-bonding regions 3*b*, 4*b*) for securing electrical connection between the light emitting element 2 and the lead frames 3, 4. The regions other than said terminal connection regions are covered with white resin. This white resin contributes to light reflection.

The inside of the recess section of the package 5 is filled with sealing inner resin 6 (also referred to as sealing resin), and light scattering material, fluorescent material, and the like is mixed into the sealing inner resin 6. For example, if the optical element 2 is a blue LED, the light emitting element can be configured to output white light with blue light by mixing in fluorescent material emitting red and green lights in the inner resin 6.

Here, the production method of the light emitting device 1 of Embodiment 1 will be explained.

Figure 3:
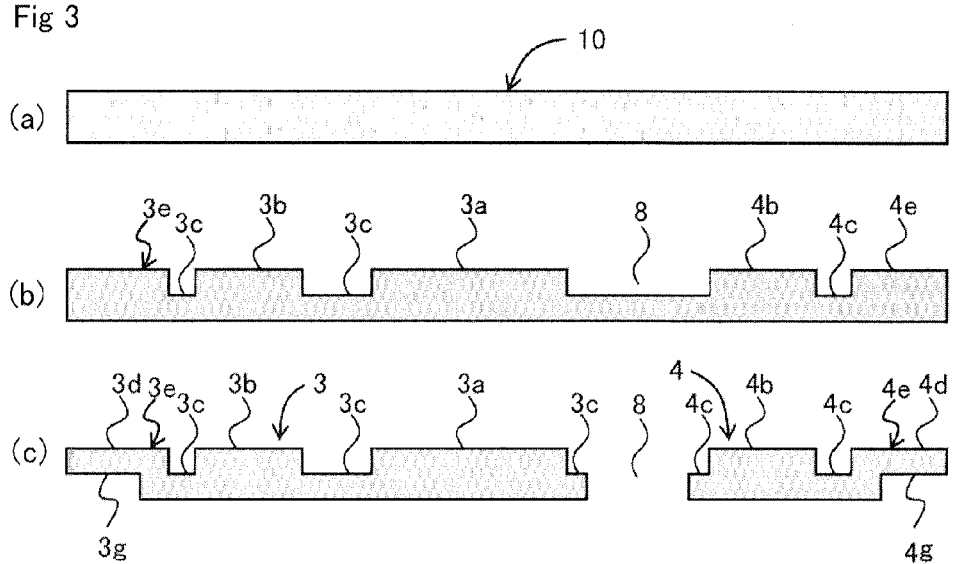
FIGS. 3(a) to 3(c) are longitudinal cross-sectional views illustrating each production step of lead frames of FIGS. 1 and 2.

FIGS. 3(*a*) to 3(*c*) are longitudinal cross-sectional views illustrating each production step of lead frames 3, 4 of FIGS. 1 and 2.

Initially, as illustrated in the lead frame surface half-etching step of FIG. 3(*b*), half etching is performed on a metallic material 10 for forming lead frames 3, 4 as illustrated in FIG. 3(*a*), using a resist mask opened in regions other than an light emitting element arrangement region 3*a*, terminal connection regions (wire-bonding regions 3*b*, 4*b*), and base sections 3*e*, 4*e* of hanger leads and hanger lead sections 3*d*, 4*d*. At this time, half-etching is performed for a separation region 8 of the lead frames 3, 4 (anode/cathode separation region). Next, as illustrated in the lead frame back surface half-etching step of FIG. 3(*c*), half-etching is performed using a resist mask opened in regions except mounting terminals 3*f*, 4*f* from the back surface side of the lead frames 3, 4. Thereby, a lead frame full-etching region such as the separation region 8 of the lead frames 3, 4 is formed and half-etched regions 3*g*, 4*g* are formed. Thereby, lead frames 3, 4 having step sections (half-etched regions 3*c*, 4*c*) and hanger lead sections 3*d*, 4*d* formed on a part of the surface are formed.

In this manner, half-etching may form a resin surface step section by etching the mounting surface side of a light emitting element 2, and then perform etching for reducing the thickness of anchor section with white resin (Pkg resin) and the hanger leads 3*d*, 4*d* (suspension lead) from the back side. Alternatively, this etching may be performed from the front surface side. Furthermore, etching may be performed on the front and back sides simultaneously. The depth of half-etching can be controlled by the etching time.

The unit configuration of the lead frames 3, 4 has been explained above. However, in actuality, a plurality of pairs having the lead frames 3, 4 as a pair are arranged in the column and row directions in a matrix pattern, and lead frames adjacent in the column and row directions are linked by hanger leads 3*d* and hanger leads 4*d* with one another.

Figure 4:
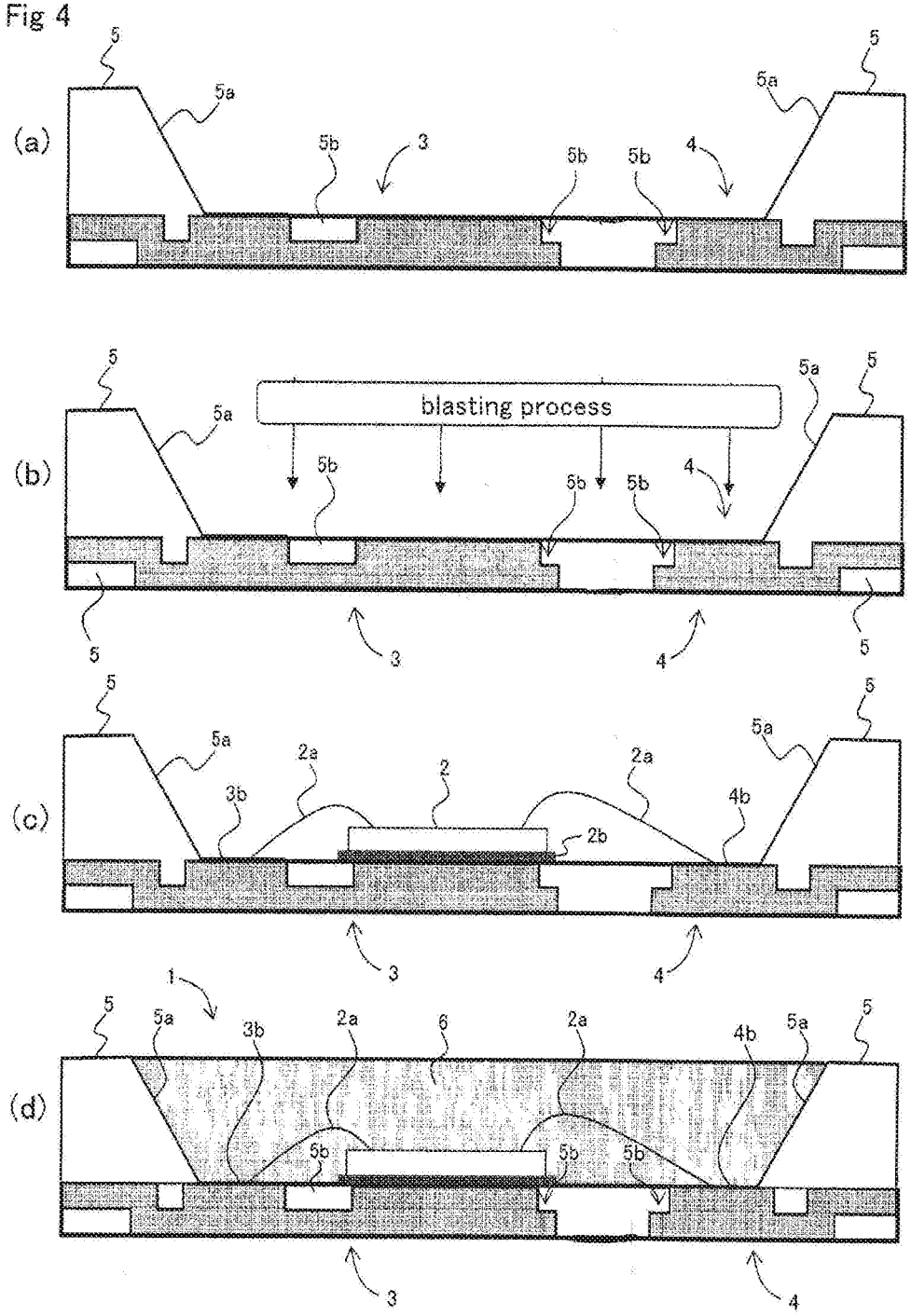
FIGS. 4(a) to 4(d) are longitudinal cross-sectional views illustrating each production step for producing the light, emitting device 1 of Embodiment 1.

FIGS. 4(*a*) to 4(*d*) are longitudinal cross-sectional views illustrating each production step for producing the light emitting device 1 of Embodiment 1.

Initially, as illustrated in FIG. 4(*a*), in a white resin cavity molding step (insert molding step), a package 5 made of white resin is integrally molded with a plurality of pairs of the lead frames 3, 4. A recess section is formed opened upward on the package 5 integrally molded with and constituted of white resin, and four side surfaces 5*a* in the recess section are formed to taper open towards the outside.

Next, as illustrated in FIG. 4(*b*), a blasting step is performed to remove burrs. In the case of thermosetting resin, burrs are generated at the time of molding. Thus, a blasting process (shower processing with particles contained in water or with only particles) is needed, and the reflectivity of a surface metallic layer of the lead frames 3, 4 (Ag plating processing) decreases.

Furthermore, as illustrated in FIG. 4(*c*), in a light emitting element mounting step (chip die bonding and wire-bonding process), a light emitting element 2 is mounted on the light emitting element arrangement region 3*a* on the lead frame 3 at the central portion of the bottom surface in the recess section of the package 5 integrally molded with and constituted of white resin. In other words, the light emitting element 2 is fixed and mounted in a predetermined position on the light emitting element arrangement region 3*a* of the lead frame 3 which is exposed in the recess section of the package 5 with an adhesive or the like. A wire 2*a* from the terminals of the light emitting element 2 is wire-bonded to each of the wire-bonding regions 3*b*, 4*b* as terminal connection regions of the lead frames 3, 4.

Next, as illustrated in FIG. 4(*d*), in a inner resin filling step, the inside of the recess section of the package 5 constituted of white resin is filled in with sealing inner resin 6 together with the light emitting element 2. Light scattering material, fluorescent material, and the like is mixed into the sealing inner resin 6 (also referred to as sealing resin). For example, if the light emitting element 2 is a blue LED, the light emitting element can be configured to output white light with blue light by mixing in fluorescent material emitting red and green lights in the inner resin 6.

After that, in a singulation step, a plate body is cut to singulate into each light emitting device 1 in a lattice pattern between each light emitting device 1 by a blade (rotating cutting blade) while a cutting tape is pasted onto the back surface of the plate body on which a plurality of light emitting devices 1 are formed in a matrix pattern. In this case, sections of the hanger leads 3*d*, 4*d* of the lead frames 3, 4 match the cut side surface of the package 5 made of white resin (Pkg resin). Further, each light emitting device 1 that is cut using a cutting tape that is not shown in the drawings does not come apart (cutting tape is eventually removed).

In the light emitting device 1 of Embodiment 1, half etched regions 3*c*, 4*c* are formed as step sections on the surfaces of the lead frames 3, 4, the surface of the lead frames 3, 4 and the white resin surface are formed to be level, and the area of the white resin surface is formed to be larger than the area of the surfaces of the lead frames 3, 4.

In this manner, the area in a plane view of the white resin surface on the reflective surface that is level with the mounting surface of the light emitting element 2 is larger than the area in a plane view occupied by the surfaces of the lead frames 3, 4 and the light emitting element 2. In other words, with improvement of light extraction efficiency under consideration, the ratio of the bottom surface in the recess section of the package 5 occupied by white resin is greater than or equal to half. Preferably, the ratio of the area in a plane view of white resin surface on the reflective surface that is level with the mounting surface of the light emitting element 2 to the total area in a plane view of the mounting surface of the light emitting element 2 (bottom surface of the recess section) is greater than or equal to two thirds, three fourths, or four fifths, as the greater the ratio, the better the light extraction characteristics. When the thickness of the lead frames 3, 4 is 250 micrometers, the depth of the step section is 120 micrometers, and the thickness of white resin filled into the step section is 120 micrometers. It is not preferred to have the thickness of the white resin being thinner than one hundred micrometers in terms of reflective performance and strength, and it is not preferred to have the thickness of the lead frames 3, 4 being thinner than half from the viewpoint of heat radiation. However, depending on the characteristics of the light emitting element, this is not always true. In the light emitting element arrangement region 3*a* and the wire-bonding regions 3*b*, 4*b*, if the area of the light emitting element arrangement region 3*a* is smaller or equal to the mounting surface of the light emitting element 2 and the light emitting element 2 is a back contact type, which requires only one wire-bonding region, the ratio of the area in a plane view of the white resin surface (reflective surface) on the reflective surface that is level with the mounting surface of the light emitting element 2 to the area in a plane view of the mounting surface of the light emitting element 2 (bottom surface of the recess section) can be exceeding one half and less than or equal to five sixths.

On the cavity configuration package 5 where lead frames 3, 4 are molded with white resin, extraction efficiency of light to the outside of the package can be raised by widening the reflector angle of a cavity and increasing the white resin covered region of the cavity bottom surface section (white resin regions on the half-etched region 3c, 4c). The adhesive strength between a wall surface section and the bottom surface section can be improved by half-etching parts of the lead frames 3, 4 that are in contact with the bottom part of the cavity wall surface sections.

According to Embodiment 1 described above, since the area in a plane view of the white resin surface on the reflective surface that is level with the mounting surface of the light emitting element 2 is configured to be larger than the total area in a plane view occupied by the surfaces of the lead frames 3, 4 and the light emitting element, light extraction efficiency can be improved due to white resin with a high reflectivity.

Further, since the step section is formed on the surfaces of the lead frames 3, 4, white resin is filled in the step section, and the area of the white resin surface on the reflective surface where the light emitting element 2 is mounted, light extraction efficiency can be improved.

Since the step section is formed on the surfaces of the lead frames 3, 4, white resin is filled in the step section, and the surfaces of the lead frames 3, 4 are formed to be level with the white resin surface, light extraction efficiency can be improved without the reflective surface where the light emitting element 2 is mounted becoming uneven as is conventional.

Furthermore, since the area of the white resin surface on the reflective surface where the light emitting element 2 is mounted is larger than the area occupied by the surfaces of the lead frames 3, 4 and the light emitting element chip, light extraction efficiency can be improved. In this case, the reflective surface of the bottom surface of the recess section of the light emitting device 1 is all white resin surface other than the light emitting element 2, light emitting element arrangement region 3a and the wire-bonding regions 3b, 4b.

Furthermore, since the step section is formed on the surfaces of the lead frames 3, 4, white resin is filled in the step section, and the adhesion area between the reflector of the cavity and the lead frames 3, 4 increases, strength against lateral pressure of a cavity wall surface can be greatly improved. Specifically, by having recess sections on the front and back surface sides along the longitudinal direction of the lead frames 3, 4, bonding strength with the white resin (Pkg resin) (stability to retain the Pkg shape) is retained. Thereby, it is also resistant to pressing force from the side wall direction.

In the above-described Embodiment 1, each production step of the lead frames 3, 4 of FIGS. 1 and 2 has been explained using FIGS. 3(a) to 3(c), but the production step is not limited to this. The lead frames 3, 4 of FIGS. 1 and 2 can also be produced using the steps of FIGS. 5(a) to 5(f).

FIGS. 5(a) to 5(f) are longitudinal cross-sectional views illustrating other examples of each production step of the lead frames 3, 4 of FIGS. 1 and 2.

Figure 5:
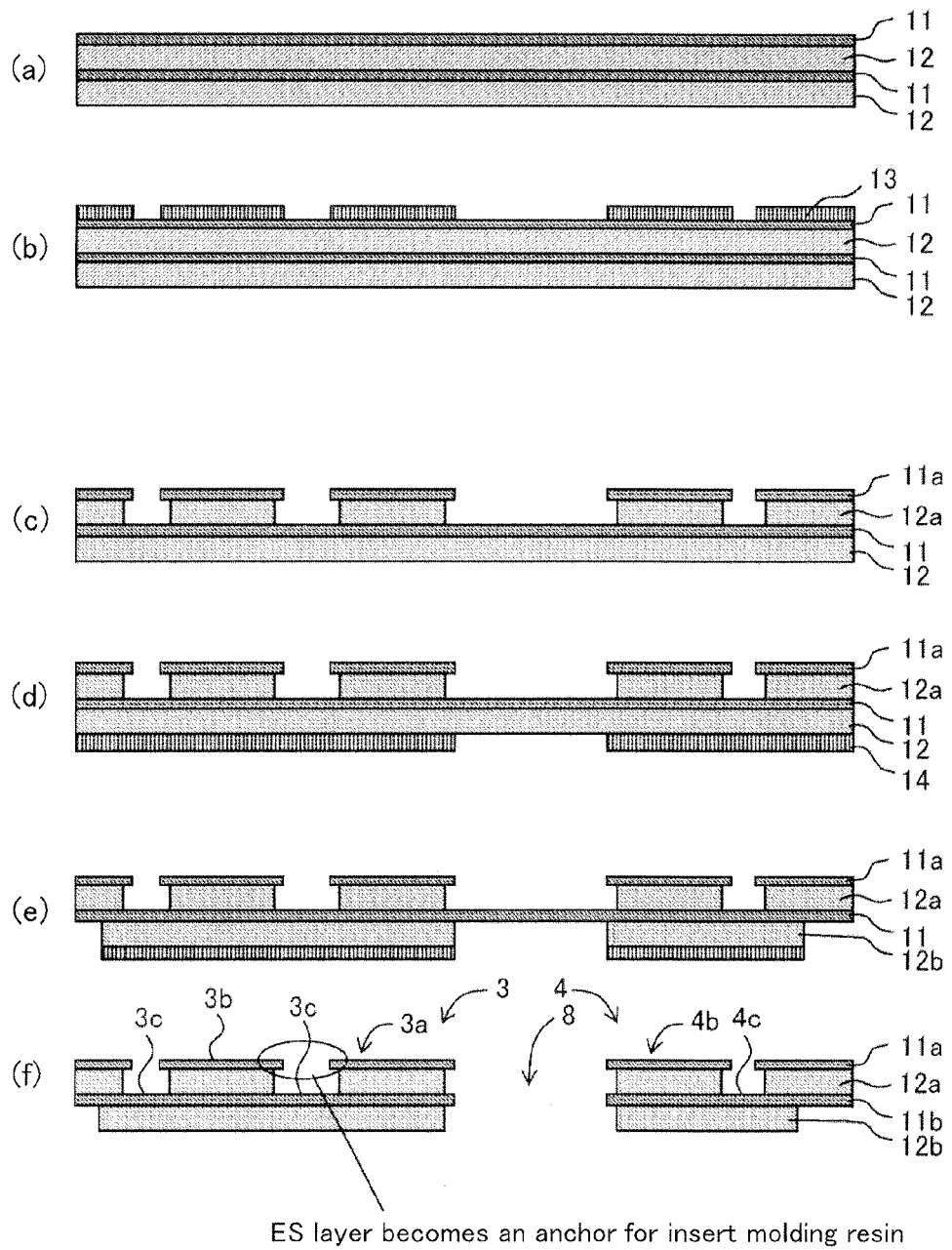
FIGS. 5(a) to 5(f) are longitudinal cross-sectional views illustrating other examples of each production step of lead frames of FIGS. 1 and 2.
Figure 6:
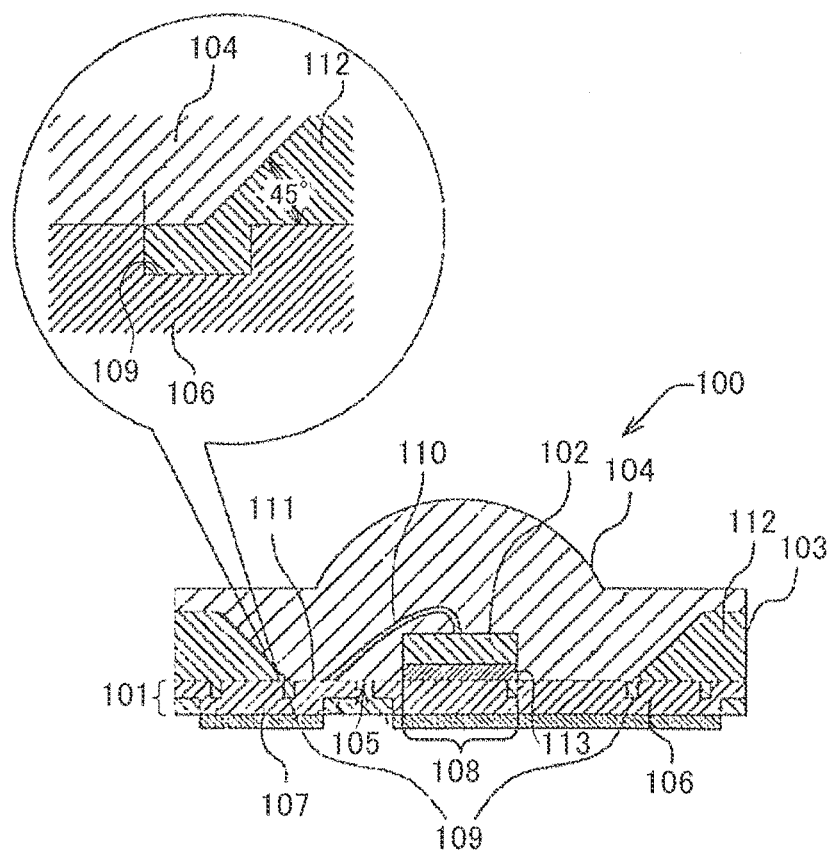
FIG. 6 is a cross-sectional view of an essential part for explaining a light emitting device, which is an example of a conventional light emitting device, disclosed in Patent Literature 1.
Figure 7:
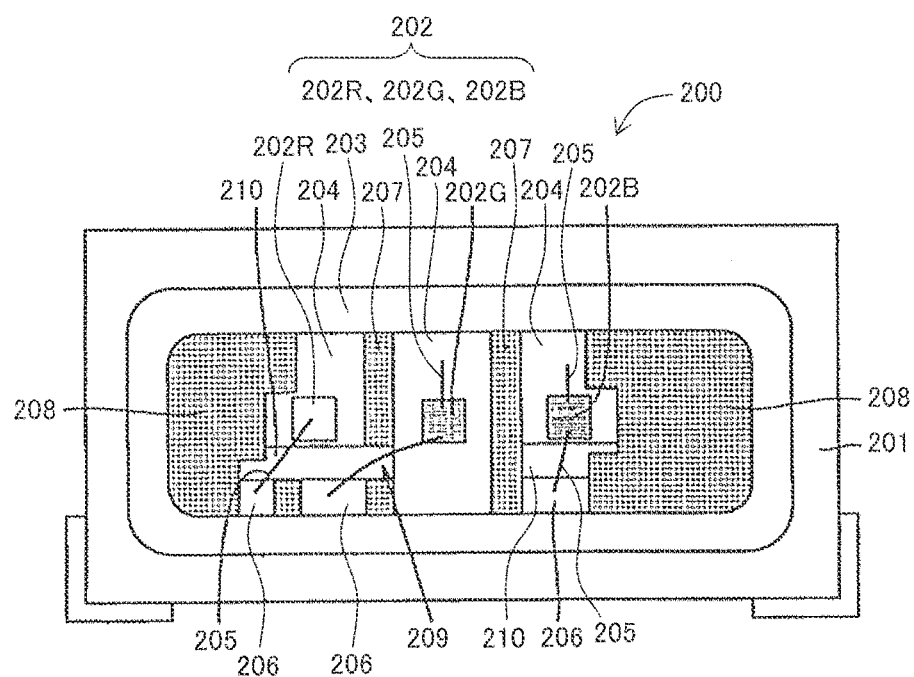
FIG. 7 is a plane view of a side-view type surface-mount light emitting diode as a conventional light emitting device disclosed in Patent Literature 2.

Initially, on lead frame metallic material where an ES (etching stop) metallic layer 11 and a base metallic layer 12 that are laminated on top and bottom are laminated on an ES (etching stop) metallic layer 11 and a base metallic layer 12 that are laminated on top and bottom as illustrated in FIG. 5(a), as illustrated in a lead frame surface half-etching step of FIGS. 5(b) and 5(c), a resist mask 13 opened in regions other than the light emitting element arrangement region 3a, terminal connection regions (wire-bonding regions 3b, 4b), and the base sections 3e, 4e of the hanger leads is formed, on the ES (etching stop) metallic layer 11. An ES (etching stop) metallic layer 11a and a base metallic layer 12a are then formed in a predetermined shape by half-etching using the resist mask 13 to form half-etched regions 3c, 4c with about half the thickness of step sections.

Next, in a lead frame separation etching step, as illustrated in FIGS. 5(d) to 5(f), on the back surface of the lead frame metallic material, in order to separate the lead frames 3, 4 a predetermined distance, a resist mask 14 opened above the separation region 8 is formed on the base metallic layer 12, and the base metallic layer 12 and the ES (etching stop) metallic layer 11 are sequentially etched from the back surface side to form layers 12b and 11b, respectively. Thereby, the separation region 8 is formed.

Thereby, lead frames 3, 4 that anchor white resin, which is insert molding resin, can be produced. In this manner, adhesiveness (bonding strength) of white resin integrally molded with the lead frames 3, 4 to the lead frames 3, 4 is improved by using a metallic lamination substrate including the ES metallic layer 11.

In the above-described Embodiment 1, a case has been explained where the feature configuration of the present invention is applied to the light emitting device 1 using the package 5, which is mounted with one light emitting element 2 that emits light and is constituted of lead frames 3, 4 constituting electrodes corresponding to one light emitting element 2 and white resin. In the feature configuration of the present invention, the lead frames 3, 4 have the light emitting element arrangement region 3a and the terminal connection regions (wire-bonding region 3b, 4b) where the light emitting element 2 is mounted and the terminals of the light emitting element 2 are connected, and a region lowered from the mounting surface of the light emitting element 2 around the light emitting element arrangement region 3a and the terminal connection regions (wire-bonding region 3b, 4b); white resin is provided in the lowered region; and the surface of the white resin and the mounting surface of the light emitting element 2 are configured to be level. The configuration is not limited to this. The above-described feature configuration of the present invention can be applied to a light emitting device using a package 5 that is mounted with a plurality (for example, two or three) of light emitting elements 2 that emit light and is constituted of lead frames 3, 4 constituting electrodes corresponding to a plurality of light emitting elements 2 and white resin. Also in this case, similarly to the case where one light emitting element 2 is mounted, the recess section is formed to open upwards on the white resin cavity molding package 5, and a plurality of light emitting element 2 are mounted on the lead frames 3, 4 in the recess section, while the side surfaces in the recess section are formed to taper open towards the outside as a reflective wall.

In the above-described Embodiment 1, although it was not explained, use of thermosetting resin with high reliability in weather resistance, light resistance and the like is made possible by moldability (crack suppression) and improved reflective performance of Pkg resin material, which is white resin material with high reflectivity. In the case of thermosetting resin, burrs are generated at the time of molding. Thus, a blasting process (shower processing with particles contained in water or with only particles) is needed, and the reflectivity of the lead frame surfaces (Ag plating processing) decreases. Conventionally, chip mounting surface was designed for more lead frame surface. However, when thermosetting resin is used for Pkg material, due to lead frame surface degradation by a blasting process, the configuration of the present invention with more Pkg resin surface can better improve the reflectivity of a chip mounting surface. Further, brightness of the light emitting device can also be improved. Further, gas corrosion and sealing resin peeling of the lead frame surface can also be reduced in the present invention.

A case has been described in the above-described Embodiment 1 where the step section is formed on a part of a surface of the lead frames 3, 4; white resin is filled in the step section, the surface of the filled white resin and the surfaces of the lead frames 3, 4 are formed to be level; one or a plurality of light emitting element 2 is mounted on the surface of the lead frames 3, 4; and the area in a plane view of white resin surface on the reflective surface that is level with the mounting surface of the light emitting element 2 is configured to be larger than the total area in a plane view occupied by the surfaces of the lead frames 3, 4 and the light emitting element 2, but is not limited to this. Instead of forming the step section on a part of the surface of the lead frames 3, 4, the exposed area of the surfaces of the lead frames 3, 4 itself can simply be made smaller. Even if the area in a plane view of white resin surface on the reflective surface that is level with the mounting surface of the light emitting element 2 is configured to be larger than the total area in a plane view occupied by the surfaces of the lead frames 3, 4 and the light emitting element 2, the objective of improving the light extraction efficiency of the present invention can be achieved.

As described above, the present invention is exemplified by the use of its preferred Embodiment 1. However, the present invention should not be interpreted solely based on Embodiments 1 described above. It is understood that the scope of the present invention should be interpreted solely based on the claims. It is also understood that those skilled in the art can implement an equivalent scope of technology, based on the description of the present invention and common knowledge from the detailed description of the preferred Embodiments 1 and 2 of the present invention. Furthermore, it is understood that any patent, any patent application, and any references cited in the present specification should be incorporated by reference in the present specification in the same manner as the contents are specifically described therein.

INDUSTRIAL APPLICABILITY

The present invention can be applied in the field of a light emitting device such as an LED device that is integrally molded with lead frames corresponding to each electrode and resin. According to the present invention described above, the area in a plane view of a white resin surface on a reflective surface that is level with a mounting surface of a light emitting element is configured to be larger than the area in a plane view occupied by a lead frame surface and a light emitting element. Thus, light extraction efficiency can be improved due to high reflectivity of the white resin. Further, since a step section is formed on the lead frame surface, white resin is filled in the step section, and the area of the white resin surface on the reflective surface where the light emitting element is mounted is increased, light extraction efficiency can be improved.

The invention claimed is:

1. A light emitting device comprising:
    a white resin molding package comprising a reflective wall, the reflective wall comprising an inner side surface which tapers to define a cavity;
    a first lead frame comprising a top surface and a back surface, the top surface including, within the cavity, a light emitting element arrangement region and a first terminal connection region;
    a second lead frame located away from the first lead frame in a first direction and comprising a top surface and a back surface, the top surface including, within the cavity, a second terminal connection region; and
    a light emitting element mounted on the light emitting element arrangement region of the first lead frame, the light emitting element comprising a first terminal and a second terminal which are respectively connected to the first terminal connection region of the first lead frame and the second terminal connection region of the second lead frame by wire bonding, wherein
    the first lead frame comprises, on its top surface side, a first step portion which is receded from the light emitting element arrangement region and the first terminal connection region of the top surface thereof, but which does not penetrate the first lead frame,
    the first step portion is provided at least around the light emitting element arrangement region and between the light emitting element arrangement region and the first terminal connection region,
    the first step portion is filled with white resin, wherein a surface of the white resin, in the cavity, is level with the light emitting element arrangement region and the first terminal connection region of the top surface of the first lead frame and functions as a reflective surface,
    the light emitting element arrangement region and the first terminal connection region of the top surface of the first lead frame, the surface of the white resin level with these regions, and the second terminal connection region of the top surface of the second lead frame define a part of a bottom surface of the cavity of the package,
    the reflective wall includes first and second reflective wall sections opposed to each other in the first direction, and third and fourth reflective wall sections opposed to each other in a second direction intersecting with the first direction,
    the first terminal connection region of the first lead frame is partially covered with the first reflective wall section, and
    the first step portion between the light emitting element arrangement region and the first terminal connection region of the first lead frame extends in the second direction such that the white resin filled in the first step portion extends both to the third reflective wall section and to the fourth reflective wall section.

2. The light emitting device according to claim 1, wherein the first step portion is provided all around the light emitting element arrangement region such that the light emitting element arrangement region is entirely surrounded by the first step portion.

3. The light emitting device according to claim 1, wherein the first step portion is also provided all around the first terminal connection region such that the first terminal connection region is entirely surrounded by the first step portion.

4. The light emitting device according to claim 1, wherein the second lead frame comprises, on its top surface side, a second step portion which is receded from the second terminal connection region of the top surface thereof, but which does not penetrate the second lead frame, and the second step portion is filled with the white resin, wherein a surface of the white resin, in the cavity, is level with the second terminal connection region of the top surface of the second lead frame and functions as a reflective surface.

5. The light emitting device according to claim 1, wherein the cavity of the package is filled with an inner resin containing fluorescent material emitting red and green lights by blue light.

6. The light emitting device according to claim 1, wherein each of the first lead frame and the second lead frame comprises at least one hanger lead, the at least one hanger lead is embedded in the white resin, and a cut surface, or end face of the hanger lead is consistent with an outer side surface of the package.

7. The light emitting device according to claim 6, wherein the first step portion is provided in all regions of the top surface of the first lead frame other than the light emitting element arrangement region, the first terminal connection region, the hanger lead, and a base section of the hanger lead.

8. The light emitting device according to claim 1, wherein the light emitting element comprises an installation surface which is installed on the light emitting element arrangement region of the first lead frame, and the light emitting element arrangement region has a size equal to or smaller than a size of the installation surface of the light emitting element.

9. The light emitting device according to claim 1, wherein the second terminal connection region of the second lead frame is partially covered with the second reflective wall section.

10. The light emitting device according to claim 1, wherein the white resin is silicone resin.

11. A light emitting device comprising:
a white resin molding package comprising a reflective wall, the reflective wall comprising an inner side surface which tapers to define a cavity;
a first lead frame having a top surface and a back surface, the top surface including, within the cavity, a light emitting element arrangement region and a first terminal connection region;
a second lead frame located away from the first lead frame in a first direction and having a top surface and a back surface, the top surface including, within the cavity, a second terminal connection region; and
a light emitting element mounted on the light emitting element arrangement region of the first lead frame, the light emitting element comprising a first terminal and a second terminal which are respectively connected to the first terminal connection region of the first lead frame and the second terminal connection region of the second lead frame by wire bonding, wherein
the first lead frame comprises, on its top surface side, a first step portion which is receded from the light emitting element arrangement region and the first terminal connection region of the top surface thereof, but which does not penetrate the first lead frame,
the first step portion is provided at least around the light emitting element arrangement region and between the light emitting element arrangement region and the first terminal connection region,
the first step portion is filled with white resin, wherein a surface of the white resin, in the cavity, is level with the light emitting element arrangement region and the first terminal connection region of the top surface of the first lead frame and functions as a reflective surface, the light emitting element arrangement region and the first terminal connection region of the top surface of the first lead frame, the surface of the white resin level with these regions, and the second terminal connection region of the top surface of the second lead frame define a part of a bottom surface of the cavity of the package, the reflective wall includes first and second reflective wall sections opposed to each other in the first direction, and third and fourth reflective wall sections opposed to each other in a second direction intersecting with the first direction, the first terminal connection region of the first lead frame is partially covered with the first reflective wall section, the first step portion between the light emitting element arrangement region and the first terminal connection region of the first lead frame extends in the second direction such that the white resin filled in the first step portion extends both to the third reflective wall section and to the fourth reflective wall section, and as the bottom surface of the cavity is viewed from above, the top surface of the first lead frame is not or almost not exposed between the light emitting element mounted on the light emitting element arrangement region and the white resin surrounding the light emitting element.

12. The light emitting device according to claim 11, wherein the first step portion is provided all around the light emitting element arrangement region such that the light emitting element arrangement region is entirely surrounded by the first step portion.

13. The light emitting device according to claim 11, the first step portion is also provided all around the first terminal connection region such that the first terminal connection region is entirely surrounded by the first step portion.

14. The light emitting device according to claim 11, wherein the second lead frame comprises, on its top surface side, a second step portion which is receded from the second terminal connection region of the top surface thereof, but which does not penetrate the second lead frame, and the second step portion is filled with the white resin, wherein a surface of the white resin, in the cavity, is level with the second terminal connection region of the top surface of the second lead frame and functions as a reflective surface.

15. The light emitting device according to claim 11, wherein the cavity of the package is filled with an inner resin containing fluorescent material emitting red and green lights by blue light.

16. The light emitting device according to claim 11, wherein each of the first lead frame and the second lead frame comprises at least one hanger lead, the at least one hanger lead is embedded in the white resin, and a cut surface, or end face of the hanger lead is consistent with an outer side surface of the package.

17. The light emitting device according to claim 16, wherein the first step portion is provided in all regions of the top surface of the first lead frame other than the light emitting element arrangement region, the first terminal connection region, the hanger lead, and a base section of the hanger lead.

18. The light emitting device according to claim 1, wherein the light emitting element comprises an installation surface which is installed on the light emitting element arrangement region of the first lead frame, and the light emitting element arrangement region has a size equal to or smaller than a size of the installation surface of the light emitting element.

19. The light emitting device according to claim 11, wherein the second terminal connection region of the second lead frame is partially covered with the second reflective wall section.

20. The light emitting device according to claim 11, wherein the white resin is silicone resin.

\* \* \* \* \*